United States Patent [19]

Granger et al.

[11] 4,013,591

[45] Mar. 22, 1977

[54] COMPOSITE SUPERCONDUCTING MATERIALS

[75] Inventors: René Granger, Thorigne; Alain Labsley, Rennes; Serge Rolland, Cesson-Sevigne, all of France

[73] Assignee: Brevatome, Paris, France

[22] Filed: Mar. 11, 1974

[21] Appl. No.: 449,749

[30] Foreign Application Priority Data

Mar. 13, 1973 France .............................. 73.08962

[52] U.S. Cl. ................................. 252/512; 252/518
[51] Int. Cl.$^2$ ........................................... H01B 1/06
[58] Field of Search ........................... 252/512, 518

[56] References Cited

OTHER PUBLICATIONS

"Chemical Abstracts," vol. 80, 1974, 53565w, p. 392.

*Primary Examiner*—Benjamin R. Padgett
*Assistant Examiner*—Josephine Lloyd
*Attorney, Agent, or Firm*—Ernest F. Marmorek

[57] ABSTRACT

Composite materials having properties of superconductivity which remain at much higher temperatures than conventional superconductors and intended for such applications as the construction of magnetometers or thermometers are provided in a divided form and in a monocrystalline matrix consisting of semiconducting material with zones of superconductivity formed by microprecipitates of one of the constituents of the semiconducting material.

7 Claims, 3 Drawing Figures

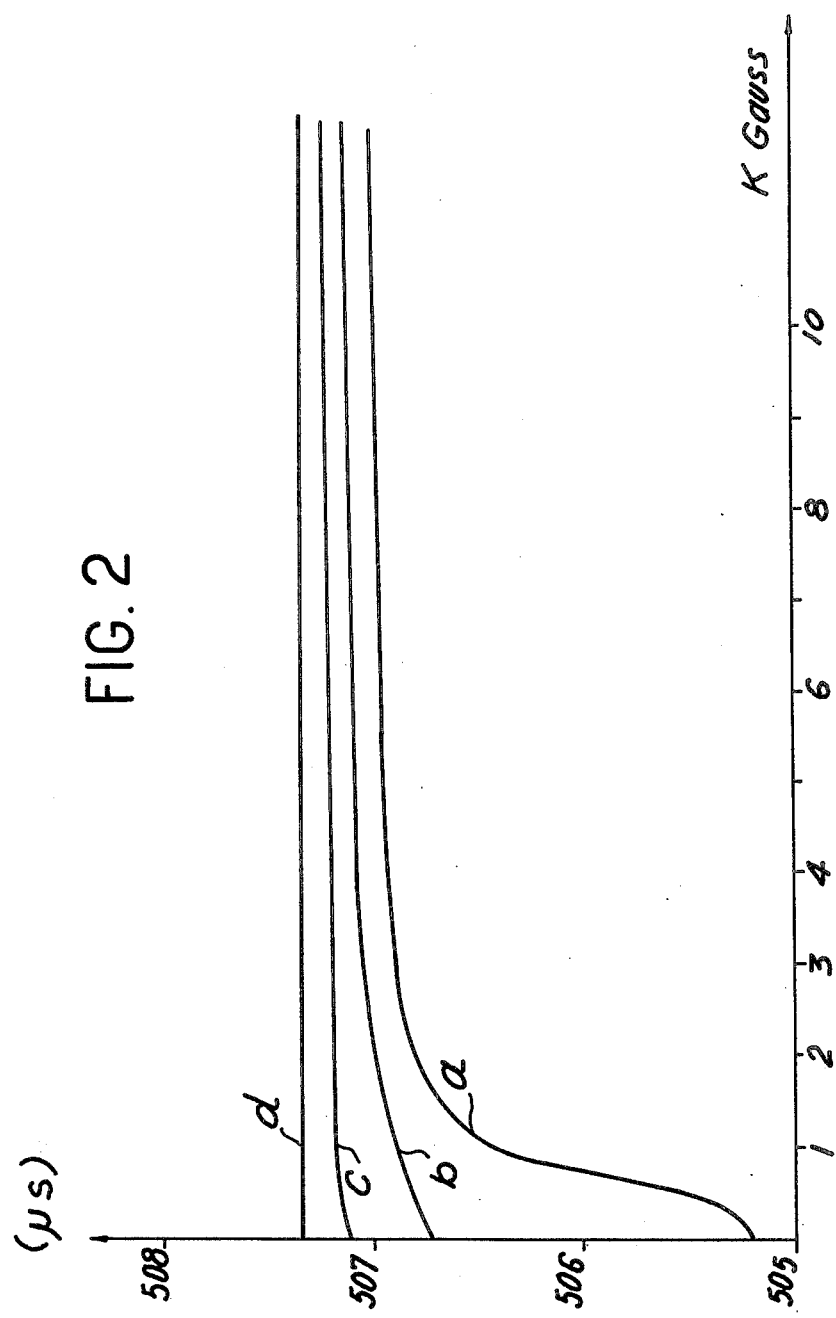

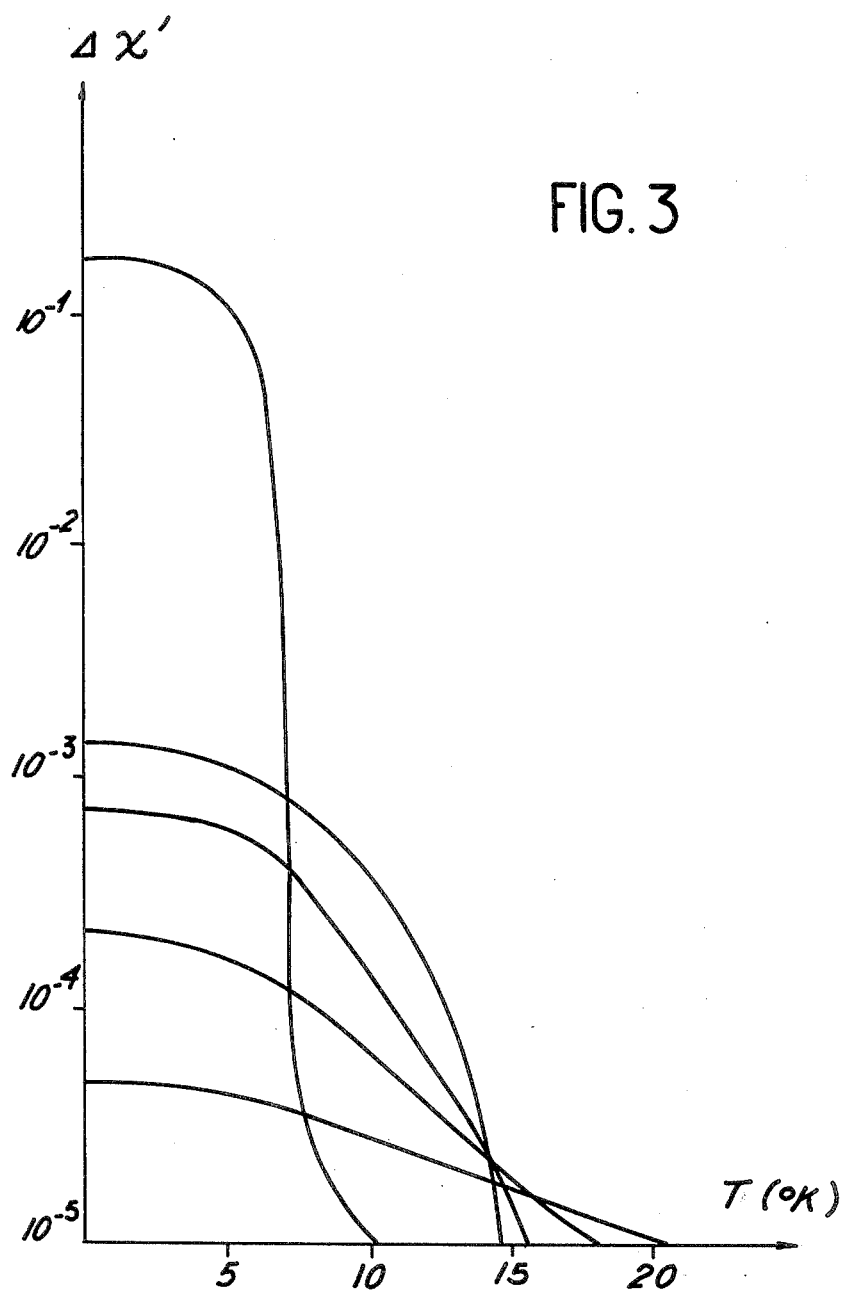

COMPOSITE SUPERCONDUCTING MATERIALS

This invention relates to novel superconducting materials and to a method for the preparation of said materials.

As is already known, a metal can be made superconducting by bringing said metal into contact with a semiconductor. This is possible if the wave functions of the electrons of the metal are capable of penetrating into the semiconductor to an appreciable depth with respect to one of the dimensions of the metal (thickness of a layer, diameter of a fiber, mean diameter of a grain, which are usually of the order of 50 A). It is therefore necessary to form a metal-semiconductor interface, such that the wave functions of the electrons of the metal penetrate as far as possible into the semiconductor.

In fact, the mechanism of superconductivity which is thus created can accordingly be explained as follows:

either an electron of the metal penetrates into the semiconductor and excites an electron of the valence band of the semiconductor within the conduction band and thus creates a virtual exciton; this exciton is absorbed by another electron of the metal which is thus in an attractive state with respect to the first, or, in the case of a highly degenerate p-type semiconductor material, an electron of the metal penetrates into the semiconductor and excites an electron from a state below the Fermi level to a higher state while yielding part of its moment $q$ to this latter. The return of the electron to its initial state makes it possible to supply a variation in moment $q$ to another electron of the metal, thus attractively coupling said electron with the first.

It has been endeavored to form metal-semiconductor interfaces which thus result in superconductivity of the metal by vacuum cleavage of a semiconductor followed by deposition of metal. However, this method of execution results in the appearance of surface states which create a space charge and thus makes it very difficult for the electrons of the metal to penetrate into the semiconductor.

The present invention is precisely directed to novel superconducting materials having properties of superconductivity which continue to remain at much higher temperatures than conventional superconductors. The invention is also directed to the method of preparation of these novel superconducting materials which is simple and easy to carry into effect.

The materials in accordance with the invention are characterized in that they are provided in a divided form and in a monocrystalline matrix constituted by a semiconductor material with zones of superconductivity formed by microprecipitates of one of the constituents of said semiconductor.

In one embodiment, the zones of superconductivity are localized within the grain boundaries of the semiconductor.

The method of preparation of the materials in accordance with the invention is characterized in that a semiconductor material is synthesized from its constituents, said material is purified by zone melting and the semiconducting single crystal is then grown by the Bridgman method, namely by fusion of the aggregate followed by slow resolidification.

Since the starting semiconductor thus exhibits a slight deviation from stoichiometry, microprecipitates of one of the constituents of the semiconductor are formed at the time of growth of the single crystal. Since the microprecipitates which appear during growth of the semiconducting single crystal are formed from the solidification front, the space charges at the metal-semiconductor interface are of low value. Moreover, the size of these precipitates can be of the order of 50 A and favorable conditions for superconductivity of the metal are thus achieved.

Superconducting materials in accordance with the invention can be prepared from any semiconductor material having a range of stoichiometry in the vicinity of the composition which defines said semiconductor, with the result that metallic microprecipitates can thus be obtained.

By way of non-limitative example of superconducting materials in accordance with the invention, the following may be mentioned:

lead telluride containing microprecipitates of lead,
lead selenide containing microprecipitates of lead,
tin telluride containing microprecipitates of tin,
alloys of the compounds hereinabove defined which contain microprecipitates of one or of both metals such as, for example, an alloy of lead telluride and tin telluride containing microprecipitates of lead and of tin.

A better understanding of the invention will be gained from the following description of one mode of preparation of a superconducting material in accordance with the invention, said material being constituted by lead telluride containing microprecipitates of lead. It will be clearly understood that this example does not have any limiting character so far as this invention is concerned.

Lead telluride is synthesized from previously pickled lead and tin having a purity of 5N in a vacuum-sealed silica vessel.

The ingot obtained is then purified by the method of horizontal zone melting. About twenty passes are required in this method and each pass lasts approximately 10 hours for a length of 300 mm. The vessel containing the lead telluride is displaced at a rate of 36 mm per hour.

Growth of the single crystal is then carried out by the Bridgman method. To this end, only the very pure central portion of the ingot obtained after the zone-melting operation is retained and placed within a sealed silica vessel. A fragment of tellurium is placed within the top portion of said vessel and is intended to be maintained at a constant temperature. The vessel is cooled slowly while displacing it progressively within a variable-temperature furnace.

There is thus obtained a cylindrical single crystal having a diameter of 10 mm and a length between 10 and 20 mm, beginning with a pointed zone which is due to the tapered shape of the vessel. This tapered shape is necessary in order to permit preferential growth in one direction.

By taking measurements of magnetic susceptibility, it is found that the material thus obtained remains superconducting up to temperatures of 23° K whereas the critical temperature of solid lead is 7.2° K. The maximum critical fields (disappearance of superconductivity) at $T = 0°$ K are 6 Kgauss and the law $$H_c(T) = H_c(T=o)\left[1 - \frac{T^2}{T_M^2}\right]$$

is verified ($T_M$ is the temperature of disappearance of superconducting behavior in a zero field).

The superconducting materials in accordance with the invention find an advantageous application in the construction of a magnetometer or of a thermometer.

The preparation of a sample of superconducting material in accordance with the invention for subsequent insertion in a measuring coil which is intended to constitute a magnetometer or thermometer element is carried out as follows:

A disc having a thickness of 1.5 mm is cut with a wire saw from the single crystal described earlier. As a result of this operation, the crystal lattice structure is destroyed to a depth of about one hundred microns. An initial mechanical polishing operation is carried out with 600-paper followed by electrolytic polishing. The sample is then rinsed with distilled water.

The applications of the materials in accordance with the invention to magnetometry and to thermometry are both based on the measurement of magnetic susceptibility which is a fundamental characteristic of superconducting material (Meissner effect). Measurement of variation of magnetic susceptibility with temperature permits the construction of a calibrated thermometer. Similarly, the measurement of variation of magnetic susceptibility of the sample permits the construction of a magnetometer. In the case of the magnetometer, it is possible in addition to adapt the temperature of the sample so as to be within a maximum range of sensitivity corresponding to the value of the magnetic field to be measured. This optimization of the temperature is possible only within a temperature range of 5° to 20° K since a substance has superconducting properties only within these values.

The principle of measurement of magnetic susceptibility is based on the determination of the inductance of a coil which surrounds the sample.

If consideration is given to a circuit constituted by a coil having a self-inductance $L_o$ and a resistance $r$ and by a series-connected capacitor having a capacitance $C_o$ at the resonant angular frequency $\omega_o$, we have:

$$L_o C_o \omega_o^2 = 1 \quad Q = \frac{L_o \omega_o}{r}$$

where $Q$ is the Q-factor of the oscillating circuit. If the sample having a complex magnetic susceptibility $\chi' + j\chi''$ is inserted in the coil, the impedance $Z$ of the coil becomes at an angular frequency $\omega$:
$Z = r + j Lo (1 + \chi' + j\chi'') \omega$. Said impedance $Z$ corresponds to a pure inductance having the value $L = Lo (1 = \chi')$ in series with a resistor having a value $r' = r + \chi'' L_o \omega$. The condition of resonance in the presence of the sample is written in the case of the new angular frequency $\omega_1$ :
$L C\omega_1^2 = {}^{Lo} (1 + \chi') C_o\omega_1^2 = 1$
By differentiating this relation, we obtain :

$$\frac{d\chi'}{1+\chi'} = -2\frac{d\omega}{\omega_1} = \frac{2\, dT}{T}$$

where $T$ is the period corresponding to the angular frequency $\omega$, $d\omega$ and $dT$ are the respective variations in angular frequency and period resulting from the change of inductance. When $\chi$ is of small value compared with 1, the variation of the real portion $\chi'$ of the magnetic susceptibility is proportional to the relative variation of the period $T$. Similarly, it is demonstrated that the relative variation of the resistance $r$ is proportional to the variation of the imaginary portion of the magnetic susceptibility $\chi''$.

$$\frac{dr}{r} = \frac{d\chi''}{\chi''}$$

Thus the variation of the period corresponding to resonance of the circuit makes it possible to determine the variation of the real portion $\chi'$ of the magnetic susceptibility. Similarly, the variation of the resistance of the circuit gives the variation of the imaginary portion $\chi''$ of the magnetic susceptibility.

In order to construct a magnetometer, the apparatus constituted by the sample-coil assembly is calibrated. To this end, the curve of response of the period of resonance as a function of the values of a given magnetic field is plotted in respect of different values of temperature. By placing the assembly consisting of sample and measuring coil in a magnetic field whose value is to be determined, a knowledge of these curves makes it possible to carry out the measuring operation aforesaid by determining the resonant frequency of the circuit and by referring to the calibration curves.

In order to construct a thermometer, the curve of the period of resonance of the coil-sample assembly is calibrated as a function of temperature within a variable-temperature chamber. The temperatures of a given medium will be measured by placing the sample in this latter and by measuring the period of resonance from which the temperature of the medium is deduced.

The variable-frequency alternating-current generator which is employed for the purpose of supplying the measuring system is an oscillator of known type (Lebeau and Pinel) which delivers current of constant amplitude irrespective of the frequency.

The variation of the imaginary portion of the magnetic susceptibility is measured by means of the variations of resistance of the coil or in other words by means of the variations of potential at the terminals of the resistor since the current delivered by the generator is constant.

The coil-sample measuring system is inserted in a resin box in which the temperature can be varied by means of a thermostat of known type.

A clearer understanding of the above-mentioned use of materials according to the invention in the field of magnetometry or thermometry will be gained from the following description in which reference is made to the accompanying drawings, wherein :

FIG. 2 shows one example of curves for measuring the period as a function of the applied magnetic field in respect of different temperatures ;

FIG. 3 shows the curves of variations of magnetic susceptibility as a function of temperature at a zero value of magnetic field.

Figure 1:
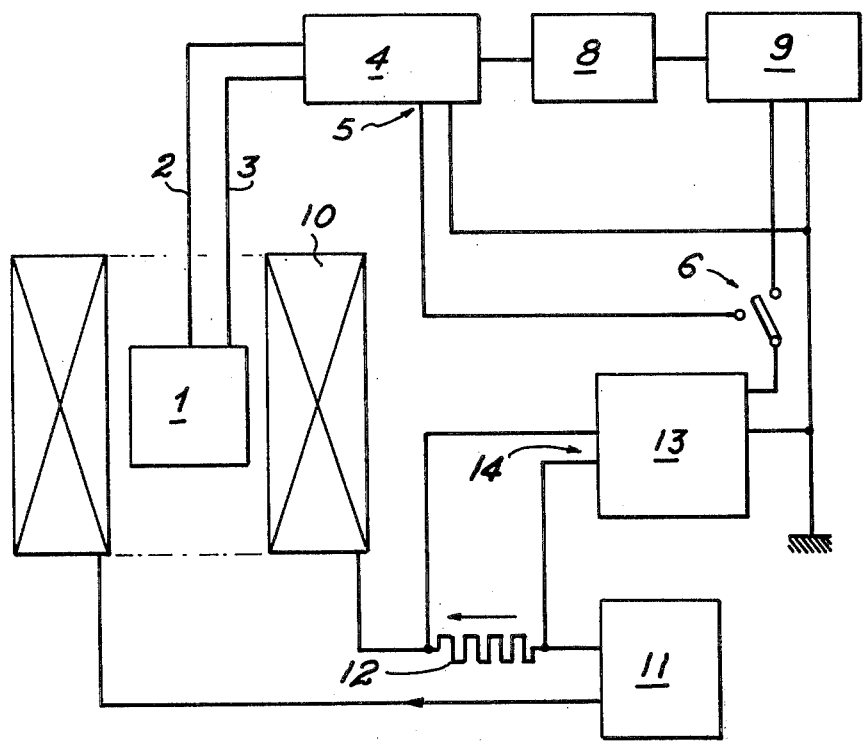
FIG. 1 shows the general arrangement of the means employed for measuring magnetic susceptibility.

The complete unit constitutes a system for measuring either temperature or magnetic field within ranges of temperatures and magnetic fields which correspond to a superconductive transition of the sample.

In this example of construction, the sample is such that the temperature range extends from 4° to 20° K and the magnetic field range extends from 0 to 6 Kgauss.

The arrangement shown in FIG. 1 makes it possible to measure the real portion and the imaginary portion of the magnetic susceptibility of the sample. The sample surrounded by the coil is placed within a resin box at 1. The current inlet and outlet leads 2 and 3 serve to connect the coil containing the sample to an oscillator 4 of the Lebeau and Pinel type.

The voltage which is delivered at 5 and the variations of which are to be measured, said variations being themselves proportional to the variations of the imaginary portion of the magnetic susceptibility, is connected through a switch 6 in ordinates as indicated by the input 7 of an automatic recorder. In order to determine the real portion of the magnetic susceptibility, the period of the current delivered is measured by means of a digital period meter 8 and this latter gives an indication which is subsequently converted by a digital-analog converter 9, then transmitted to the input 7 of the automatic recorder via the second channel of the switch 6. The magnetic field which is to be measured or which serves to calibrate the magnetometer is produced by a superconducting coil 10 which is fed by a stabilized supply 11. By means of a resistor 12, the flow of current through the coils is measured ; the value of the magnetic field which is proportional to the current is directed to the input 14 of abscissae within the recorder 13.

There are shown in FIG. 2 the curves of calibration of the period corresponding to the resonance of the circuit as measured by the period meter as a function of the magnetic field applied by the coils and expressed in kilogauss. The curve $a$ is plotted in respect of a temperature of 4.2° K, the curve $b$ is plotted in respect of a temperature of 9.1° K, the curve $c$ is plotted in respect of a temperature of 13.4° K, the curve $d$ is plotted in respect of a temperature of 20° K.

A knowledge of these curves makes it possible at a given temperature to determine the value of the magnetic field by measuring the resonant frequency of the coil.

There are shown in FIG. 3 in the case of a zero external magnetic field the curves which indicate the variations of magnetic susceptibility as a function of temperature in respect of different samples. The value of magnetic susceptibility in the case of a zero external magnetic field as measured by the method indicated in FIG. 1 makes it possible to determine the temperature of the sample from the curves of FIG. 3.

The superconducting materials in accordance with the invention can also be employed for the manufacture of a series of Josephson diodes. In fact, if a fragment of the composite material in accordance with the invention is isolated and two gold contacts, for example, are vaporized at both ends of said fragment, conduction through said fragment can take place as a result of the Josephson effect.

Furthermore, if the superconducting particles of the materials in accordance with the invention are very close to each other, a superconducting filament can be formed by isolating a fragment of said materials.

What is claimed is:
1. A composite superconducting material comprising in combination,
    a monocrystalline matrix composed of a semiconductor substance exhibiting superconducting properties, and
    microprecipitated dispersed within said matrix establishing zones, said microprecipitates constituting a metallic constituent of said semiconductor substance.
2. The material as claimed in claim 1, wherein said zones are localized within grain boundaries of the semiconductor substance.
3. The material as claimed in claim 1, wherein said semiconductor substance is lead telluride and said microprecipitates are lead.
4. The material as claimed in claim 1, wherein said semiconductor substance is lead selenide and said microprecipitates are lead.
5. The material as claimed in claim 1, wherein said semiconductor substance is tin telluride and said microprecipitates are tin.
6. The material as claimed in claim 1, wherein said semiconductor substance is in alloy of compounds selected from the group consisting of lead telluride, lead selenide, and tin telluride and said microprecipitates are at least one of the metallic constituents of said semiconductor substance.
7. The material as claimed in claim 1, wherein said semiconductor substance is an alloy of lead telluride and tin telluride and said microprecipitates are lead and tin.

* * * * *

UNITED STATES PATENT OFFICE
CERTIFICATE OF CORRECTION

Patent No. 4,013,591             Dated March 22, 1977

Inventor(s) René GRANGER, Alain LABSLEY, and Serge ROLLAND

It is certified that error appears in the above-identified patent and that said Letters Patent are hereby corrected as shown below:

In the heading:

following the name of the inventors, delete "[73] Assignee: Brevatome, Paris, France" and insert --[73] Assignee: Agence Nationale de Valorisation de la Recherche - Anvar-, Michelis, France. --.

Signed and Sealed this

Sixth Day of September 1977

[SEAL]

Attest:

RUTH C. MASON            LUTRELLE F. PARKER
*Attesting Officer*           *Acting Commissioner of Patents and Trademarks*